US009519317B2

(12) United States Patent
Hou et al.

(10) Patent No.: US 9,519,317 B2
(45) Date of Patent: Dec. 13, 2016

(54) LOCKING COMPONENT, LOCKING DEVICE AND HOST SECURING AN INTERFACE CARD

(71) Applicant: Lenovo Enterprise Solutions (Singapore) Pte. Ltd., Singapore (SG)

(72) Inventors: Kai Chung Hou, Taipei (TW); Zhi Da Huang, Taipei (TW)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/869,284

(22) Filed: Sep. 29, 2015

(65) Prior Publication Data
US 2016/0095237 A1 Mar. 31, 2016

(51) Int. Cl.
G06F 1/18 (2006.01)
F16B 2/10 (2006.01)
(Continued)

(52) U.S. Cl.
CPC ............... *G06F 1/186* (2013.01); *F16B 2/10* (2013.01); *F16B 2/12* (2013.01); *G06F 1/185* (2013.01); *H05K 7/1409* (2013.01); *H05K 7/1485* (2013.01)

(58) Field of Classification Search
CPC .................................. G06F 1/185; G06F 1/186
(Continued)

(56) References Cited

U.S. PATENT DOCUMENTS

2003/0107878 A1* 6/2003 Kaminski ............ G06F 1/184
361/759

2005/0111179 A1* 5/2005 Wu .................. G06F 1/184
361/679.32
(Continued)

FOREIGN PATENT DOCUMENTS

TW 201218922 A 5/2012
TW 201225800 A 6/2012

OTHER PUBLICATIONS

Taiwan application 103133813 Search Report, 1 page.

*Primary Examiner* — Adrian S Wilson
(74) *Attorney, Agent, or Firm* — Katherine S. Brown; Jeffrey L. Streets

(57) ABSTRACT

A locking component, a locking device and a host comprising the locking device are disclosed. The host comprises a card slot which extends along a second direction for inserting an interface card in a first direction which is substantially perpendicular to the second direction. The locking component includes a locking element and a pivot element. The locking element includes two opposite sliding slots each of which has a first and a second slide portion connecting each other. The locking element is adapted for sliding in the second direction such that the first and second slide portions of each sliding slot maintain a distance. The pivot element is adapted for passing through the sliding slots to be disposed at a host such that the locking element is pivotable about the pivot element. Upon positioning the pivot element at the first slide portions, the locking element is rotatable from an open position to an intermediate position. Upon sliding the locking element along the second direction to move the pivot element from the first slide portions to the second slide portions, the locking element is movable from the intermediate position to a lock position to lock the interface card.

20 Claims, 4 Drawing Sheets

(51) Int. Cl.
*F16B 2/12* (2006.01)
*H05K 7/14* (2006.01)

(58) Field of Classification Search
USPC ............... 361/679.31, 679.32, 679.4–679.45
See application file for complete search history.

(56) References Cited

U.S. PATENT DOCUMENTS

| | | | |
|---|---|---|---|
| 2005/0111203 A1* | 5/2005 | Bassett | G06F 1/184 361/755 |
| 2005/0135055 A1* | 6/2005 | Wang | G06F 1/184 361/679.32 |
| 2006/0007664 A1* | 1/2006 | Jing | G06F 1/184 361/801 |
| 2009/0168372 A1* | 7/2009 | Tang | G06F 1/186 361/748 |
| 2009/0168376 A1* | 7/2009 | Tang | G06F 1/185 361/756 |
| 2012/0134088 A1* | 5/2012 | Li | H05K 7/1408 361/679.4 |

* cited by examiner

LOCKING COMPONENT, LOCKING DEVICE AND HOST SECURING AN INTERFACE CARD

CROSS-REFERENCE TO RELATED APPLICATIONS

This application claims the right of priority based on Taiwan Patent Application No. 103133813 filed on Sep. 29, 2014, which is incorporated herein by reference and assigned to the assignee herein.

BACKGROUND

Field of the Invention

The present application relates to a locking component and, in particular, to a locking device and a host having the locking component.

Background of the Related Art

At present, a plurality of interface cards, such as graphic cards, audio effect cards, network adapter cards, and television cards, are commonly inserted in a computer host, such as a personal computer or a server. When being inserted into expansion card slots of the host, the interface cards are usually fixed with screws on the housing of the host. However, this manner of fixing makes the assembling and disassembling of the interface cards time-consuming and difficult.

BRIEF SUMMARY

One embodiment provides a locking component, comprising: a locking element including two opposite sliding slots each of which has a first and a second slide portion connecting each other, wherein the locking element is slidable along a second direction such that the first and second portions of each sliding slot maintain a distance in a first direction that is substantially perpendicular to the second direction; a pivot element passing through the sliding slots, the pivot element to be disposed at a host, such that the locking element is pivotable relative to the host, wherein upon positioning the pivot element at the first slide portions of the locking element, the locking element is rotatable from an open position to an intermediate position, and upon sliding the locking element along the second direction to move the pivot element from the first slide portions to the second slide portions of the locking element, the locking element is movable from the intermediate position to a lock position to lock an interface card that has been inserted in the first direction into a card slot of the host which extends along the second direction.

Another embodiment provides a locking device, comprising: a locking element; two opposite retaining elements coupled to a host, wherein each retaining element has a sliding slot which has a first and a second slide portion connecting each other, wherein the locking element is slidable along a second direction, while the first and second slide portions of each sliding slot maintain a distance in a first direction which is substantially perpendicular to the second direction; and a pivot element coupled to the locking element and the sliding slots, such that the locking element is pivotable about the pivot element, wherein upon positioning the pivot element at the first slide portions of the retaining elements, the locking element is rotatable from an open position to an intermediate position, and upon sliding the locking element along the second direction to move the pivot element from the first slide portions to the second slide portions, the locking element is movable from the intermediate position to a lock position to lock an interface card that has been inserted in the first direction into a card slot of the host which extends along the second direction.

A further embodiment provides a host, comprising: a card slot, extending along a second direction, the card slot being for inserting an interface card in a first direction which is substantially perpendicular to the second direction; a locking device which comprises: a locking element; two opposite retaining elements, wherein each retaining element has a sliding slot which has a first and a second slide portion connecting each other, and the locking element is slidable along the second direction, while the first and second slide portions of each sliding slot maintain a distance in the first direction; and a pivot element coupled to the locking element and the sliding slots, such that the locking element is pivotable about the pivot element, wherein upon positioning the pivot element at the first slide portions of the retaining elements, the locking element is rotatable from an open position to an intermediate position, and upon sliding the locking element along the second direction to move the pivot element from the first slide portions to the second slide portions of the retaining elements, the locking element is movable from the intermediate position to a lock position to lock the interface card.

BRIEF DESCRIPTION OF THE SEVERAL VIEWS OF THE DRAWINGS

A detailed description of the various embodiments will be provided, with reference to the accompanying drawings. These drawings only depict typical embodiments and therefore cannot be considered to limit the scope of the invention.

DETAILED DESCRIPTION

Figure 1:
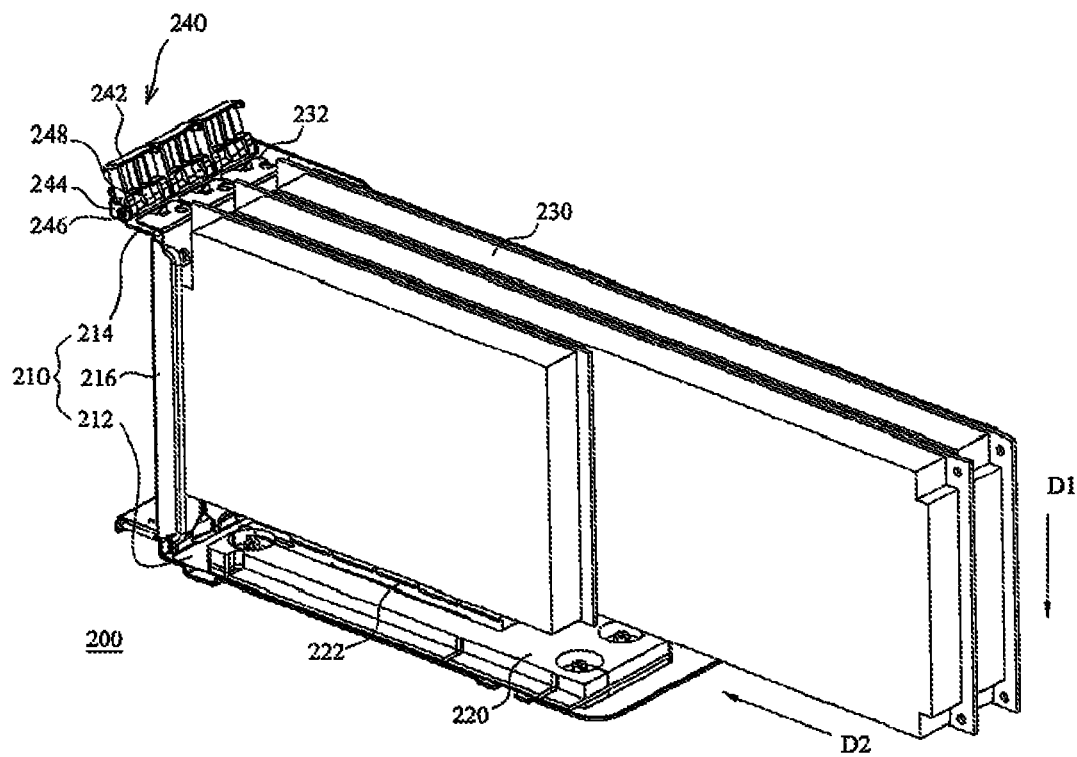
FIG. 1 is a perspective view showing part of a host according to a first embodiment.

The following provides a more detailed description of the various embodiments with reference to the drawings. However, a person skilled in the art may modify the embodiments disclosed in the following description. Therefore, a person skilled in the art should consider the following description to be a broad and explanatory disclosure, but not a limitation to the scope of the invention.

"One embodiment", "a certain embodiment" or other similar expressions described indicates that the features, advantages or characteristics related to the embodiment are included in at least one embodiment. Therefore, features advantages or characteristics described as "in one embodiment", "in a certain embodiment" or other similar expressions that may occur in the description, may be, but are not necessarily, the same embodiment.

One embodiment provides a locking component comprising a locking element including two opposite sliding slots, wherein each of the two slots has a first and a second slide portion in open communication with each other. The locking element is slidable along a second direction such that the first and second portions of each sliding slot maintain a distance in a first direction that is substantially perpendicular to the second direction. The locking component further comprises a pivot element, such as a pivot pin, passing through the sliding slots, wherein the pivot element is secured to a host, such as a housing, so that the locking element is pivotable relative to the host. Upon positioning the pivot element at the first slide portions of the locking element, the locking element is rotatable from an open position to an intermediate position, and upon sliding the locking element along the second direction to move the pivot element from the first slide portions to the second slide portions of the locking element, the locking element is movable from the intermediate position to a lock position to lock an interface card that has been inserted in the first direction into a card slot of the host which extends along the second direction.

Another embodiment provides a locking device comprising a locking element and two opposite retaining elements coupled to a host, such as a housing of a host. Each retaining element has a sliding slot which has a first slide portion and a second slide portion connecting each other, wherein the locking element is slidable along a second direction, while the first and second slide portions of each sliding slot maintain a distance in a first direction which is substantially perpendicular to the second direction. The locking device further comprises a pivot element coupled to the locking element and the sliding slots, such that the locking element is pivotable about an axis defined by the pivot element. Upon positioning the pivot element at the first slide portions of the retaining elements, the locking element is rotatable from an open position to an intermediate position, and upon sliding the locking element along the second direction to move the pivot element from the first slide portions to the second slide portions, the locking element is movable from the intermediate position to a lock position to lock an interface card that has been inserted in the first direction into a card slot of the host which extends along the second direction.

A further embodiment provides a host comprising a card slot extending along a second direction, the card slot being for inserting an interface card in a first direction which is substantially perpendicular to the second direction. The host further comprises a locking device as described above.

Figure 2A:
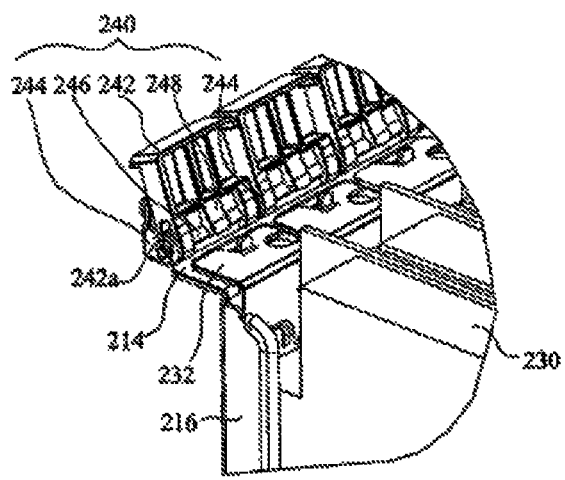
FIG. 2A is a partial perspective view showing part of the host in FIG. 1.
Figure 2B:
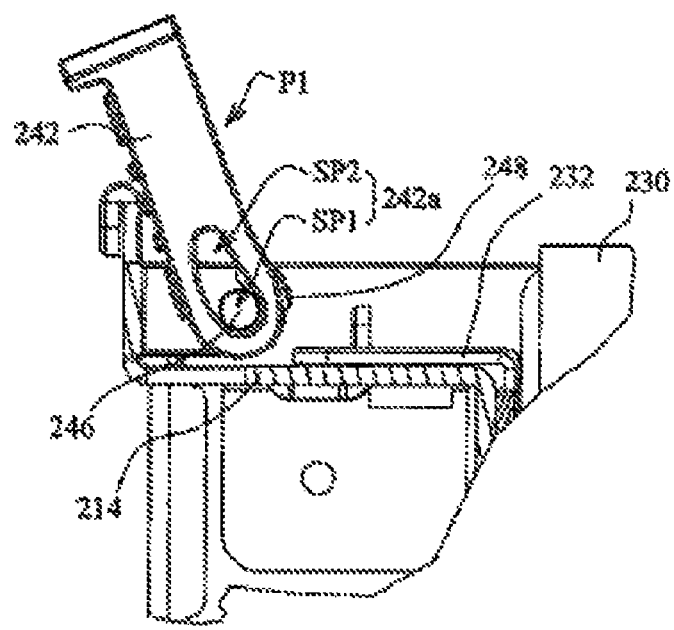
FIG. 2B is a side view of FIG. 2A.

FIG. 1 is a perspective view showing part of a host according to a first embodiment, FIG. 2A is a partial perspective view showing part of the host in FIG. 1, and FIG. 2B is a partial cross-sectional side view of FIG. 2A omitting some elements of the host.

Referring to FIG. 1, FIG. 2A and FIG. 2B, the host 200 in the embodiment may be a personal computer host or a server, including a housing 210 (only part of the housing is shown), a circuit board 220, a plurality of interface cards 230 and a plurality of locking devices 240. The host may also include other electronic devices, such as a data storage device (e.g. hard disk drive or DVD drive) and a CPU, which are not shown in the drawings.

The circuit board 220, having a plurality of card slots 222 (FIG. 1 illustratively shows one), is disposed at the bottom portion 212 of the housing 210. Each card slot 222, such as an expansion card slot or socket, extends along the circuit board 220 in a second direction D2. Each interface card 230 is inserted into the corresponding card slot 222 in a first direction D1 which is substantially perpendicular to the second direction D2. Each interface card 230 that is inserted into the corresponding card slot 222 has an end portion 232 that is disposed at a supporting portion 214 of the housing 210, wherein the supporting portion 214 is connected to a side portion 216 of the housing 210. The interface cards 230 may, for example, each be independently selected from graphics cards, audio effect cards and network cards (or television cards).

The locking devices 240 are disposed at the supporting portion 214 of the housing 210. Each locking device 240 includes a locking element 242, two opposite retaining elements 244, a pivot element 246 and an elastic element 248. Each retaining element 244 is fixed on the housing 210 of the host 200. In the embodiment, each retaining element 244 may be formed integrally with the supporting portion 214 of the housing 210. Each locking element 242 includes two opposite sliding slots 242a each of which has a first slide portion SP1 and a second slide portion SP2 connecting each other.

In each locking device 240, the pivot element 246 is adapted for passing through the sliding slots 242a to be secured to the retaining elements 244, such that the locking element 242 may be pivoted at the retaining elements 244 by means of the pivot element 246. Each locking element 242 is preferably positioned between two retaining elements 244. Moreover, in each locking device 240, the elastic element 248 disposed at the locking element 242 is used to increase frictional force between the pivot element 246 and the second slide portions SP2 (see details below). In this embodiment, the elastic element 248 of each locking device 240 may be a plastic spring piece and may be formed integrally with the corresponding locking element 242. In another embodiment, the elastic element of each locking device may be a metal spring piece or a coil spring separately manufactured and fixed at the locking element by a fastener, such as a screw, or thermal welding. Moreover, in another embodiment, each locking device may not be equipped with an elastic element.

Figure 3A:
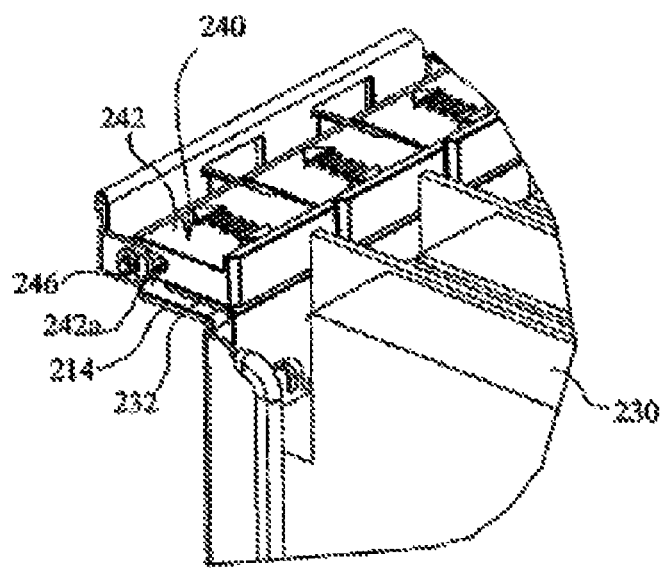
FIG. 3A is another partial perspective view showing part of the host according to the first embodiment.
Figure 3B:
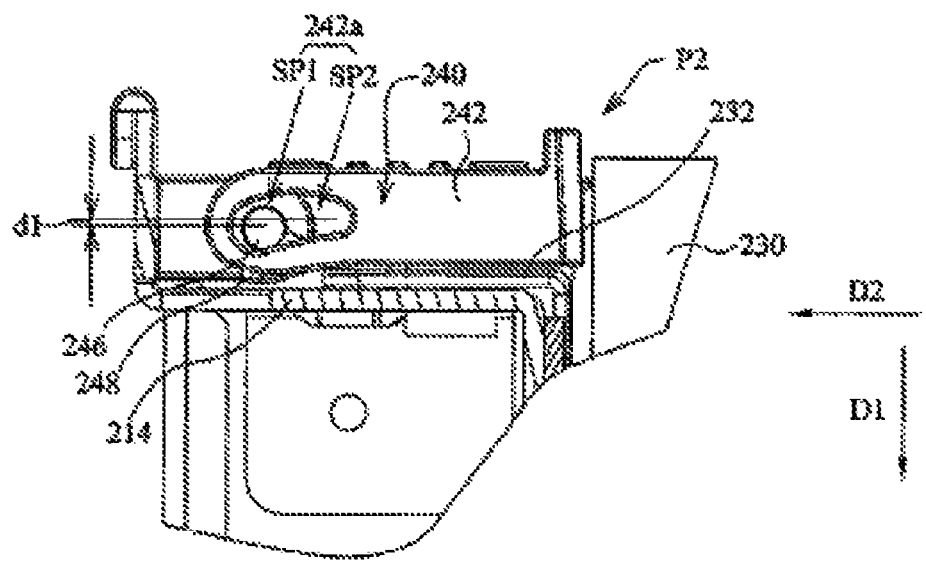
FIG. 3B is a side view of FIG. 3A.
Figure 4A:
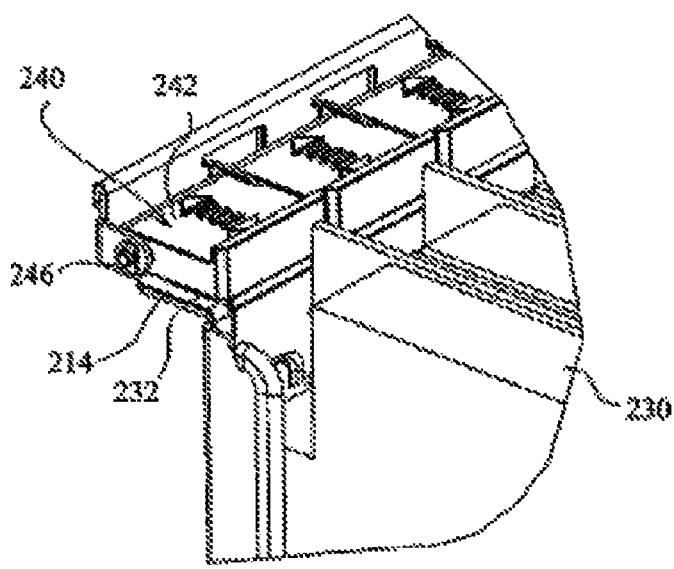
FIG. 4A is another partial perspective view showing part of the host according to the first embodiment.
Figure 4B:
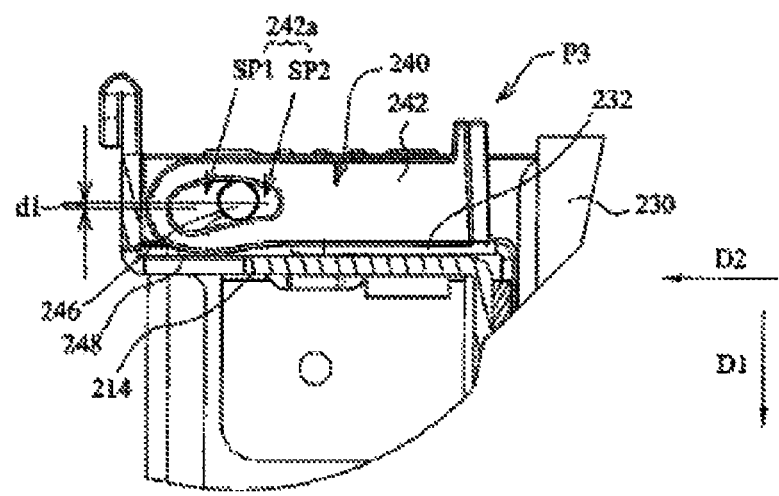
FIG. 4B is a side view of FIG. 4A.

The movements of each locking device 240 are described in detail as follows. FIG. 3A is another partial perspective view showing part of the host according to the first embodiment, FIG. 3B is a partial cross-sectional side view of FIG. 3A, FIG. 4A is another partial perspective view showing part of the host according to the first embodiment, and FIG. 4B is a partial cross-sectional side view of FIG. 4A. To simplify the description, FIG. 3B and FIG. 4A show partial sections by omitting some elements of the host.

First referring to FIG. 2A, FIG. 2B, FIG. 3A and FIG. 3B, in each locking device 240, when the pivot element 246 is located at the first slide portions SP1 of the sliding slots 242a, the locking element 242 is adapted for being rotated from an open position P1 (see FIG. 2A and FIG. 2B) to an intermediate position P2 (see FIG. 3A and FIG. 3B). Next, referring to FIG. 3A, FIG. 3B, FIG. 4A and FIG. 4B, in each locking device 240, after sliding from the intermediate position P2 along the second direction D2 such that the pivot element 246 moves relatively to the locking element 242 from the first slide portions SP1 to the second slide portions SP2, the locking element 242 is positioned at a lock position P3 and adapted to lock the end portion 232 of the interface card 230 to the supporting portion 214 of the housing 210.

Note that when each locking element 242 slides along the second direction D2, the first slide portion SP1 and the second slide portion SP2 of each sliding slot 242a maintain a distance dl in the first direction, and the first slide portion SP1 of each sliding slot 242a is closer, compared with the second slide portion SP2 of each sliding slot 242a, to the supporting portion 214 of the housing 210. Therefore, in the lock position P3, each locking element 242 imposes pressure on the end portion 232 of the interface card 230 such that the locking is achieved. Moreover, when each locking element 242 is in the lock position P3, the corresponding elastic element 248 is deformed such that the frictional force between the pivot element 246 of the locking device 240 and the second slide portions SP2 of the corresponding sliding slots 242a increases. Therefore, each locking element 242 can firmly stay at the lock position P3.

When users need to dissemble one of the interface cards 230, users may slide, from the lock position P3 to the intermediate position P2, the locking element 242 of the corresponding locking device 240 in a direction reverse to the second direction D2, then rotate the locking element 242 to the open position P1, and remove the interface card 230 from the card slot 222 in a direction reverse to the first direction D1.

Based on the above description, as the host 200 in the embodiment has the locking devices 240, the fixing and dissembling of the interface cards 230 becomes more convenient and easier compared with the prior art. In addition, each locking device 240 slides in the second direction D2 extending along the corresponding card slot 222, so that each locking device can be disposed more closely spaced with an adjacent locking device (in a lateral direction that is both perpendicular to the first direction D1 and the second direction D2). Moreover, since each locking element 242 has one of the elastic elements 248, when each locking element 242 is at the lock position P3, the deformation of the corresponding elastic element 248 increases the frictional force between the pivot element 246 of the locking device 240 and the second slide portions SP2 of the corresponding sliding slots 242a. Therefore each locking element 242 can stay firmly at the lock position P3.

Figure 5:
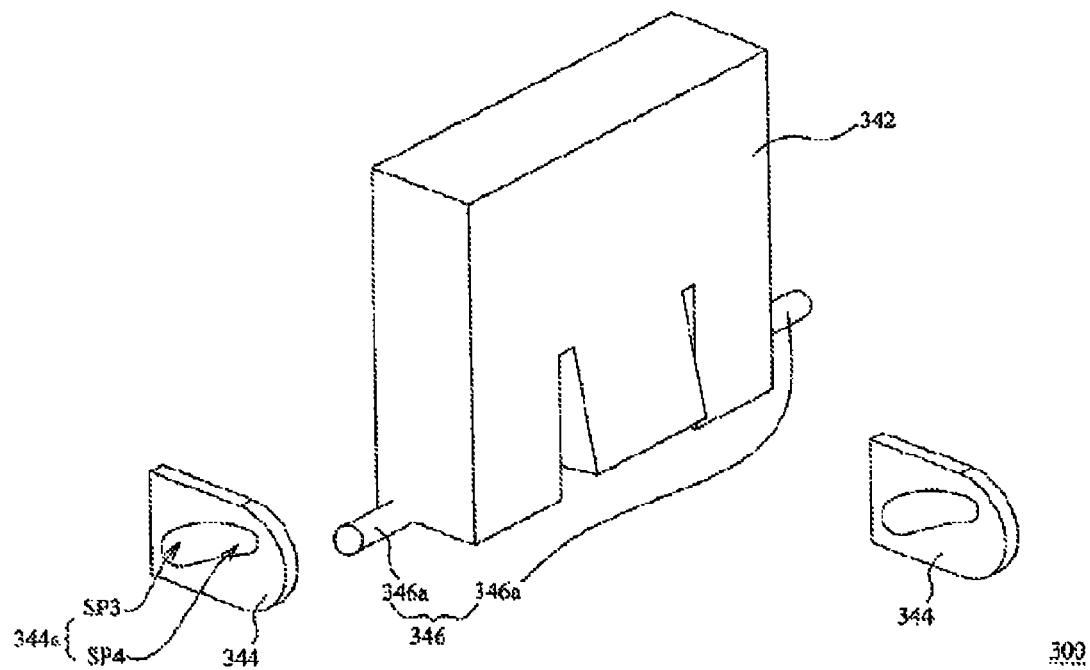
FIG. 5 is an exploded perspective view showing a locking device according to a second embodiment.

FIG. 5 is an exploded perspective view showing a locking device according to a second embodiment. Referring to FIG. 5, the movement process of the locking device 300 in this embodiment is similar to that of the locking device 240 in the first embodiment, though some differences still remain between the two. Each retaining element 344 of the locking device 300 has a sliding slot 344a which has a first slide portion SP3 and a second slide portion SP4 connecting each other. The pivot element 346 of the locking device 300 has two opposite sliding portions 346a fixed to the locking element 342. The sliding portions 346a are respectively disposed at the sliding slots 344a such that the locking element 342 is pivoted at the retaining elements 344 by means of the pivot element 346. The pivot element 346 may be formed integrally with the locking element 342.

The movement of the locking device 300 in this embodiment is the same as the movement of the locking device 200 in the first embodiment. Accordingly, a detailed description of the movement is not provided.

In the disclosed embodiments, the locking device allows the fixing and dissembling of the interface card relative to the host card slots to become more convenient and easier to accomplish compared with the prior art. In addition, each locking device slides in the second direction extending along the corresponding card slot, so that each locking device can be spaced more closely to an adjacent locking device (in a lateral direction both perpendicular to the first direction and the second direction). Moreover, where the locking element includes an elastic element, the deformation of the corresponding elastic element when the locking element is in the lock position will increase the frictional force between the pivot element of the locking device and the second slide portions of the corresponding sliding slots. Therefore, each locking element can firmly stay at the lock position P3.

Without departing from the scope of the invention, other specific forms may be used to carry out the invention. The detailed description of the embodiments should be considered as merely illustrative and not restrictive. Accordingly, the scope of the invention is as claimed in the appended claims rather than as shown in the foregoing description. All the alterations and equivalents within the scope of in the invention should be considered as falling within the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:
1. A locking device, comprising:
    two opposite retaining elements coupled to a rigid housing of a host;
    a pivot element secured between the two opposite retaining elements; and
    a locking element including two opposite sliding slots, each sliding slot having first and second slide portions in communication with each other, wherein each sliding slot is angled relative to a second direction between the first and second slide portions, wherein the pivot element extends through the sliding slots;
    wherein upon disposing the pivot element in the first slide portions of the locking element, the locking element is pivotable about the pivot element from an open position to an intermediate position, and wherein upon sliding the locking element along the second direction to move the pivot element from the first slide portions to the second slide portions of the locking element, the locking element is movable from the intermediate position to a lock position to lock an interface card that has been inserted in a first direction into a card slot of the host, wherein the card slot extends along the second direction.

2. The locking component of claim 1, further comprising:
an elastic element secured to the locking element, wherein upon disposing the locking element in the lock position, the elastic element is deformed to increase frictional force between the pivot element and the second slide portions of the locking element.

3. The locking component of claim 2, wherein the elastic element is a spring piece or a spring.

4. The locking component of claim 1, wherein the first direction is substantially perpendicular to the second direction.

5. The locking component of claim 1, wherein the two opposite sliding slots are located near a distal end of the locking element, and wherein the distal end of the locking element is angled relative to the second direction toward the interface card.

6. The locking component of claim 1, wherein a distance between the pivot element and the interface card prevents the locking element from pivoting about the pivot element when the locking element is in the lock position.

7. The locking component of claim 1, wherein the pivot element has a pivot axis that is perpendicular to the first direction and the second direction.

8. The locking component of claim 1, wherein the locking element is narrower than the interface card.

9. A locking device, comprising:
two opposite retaining elements coupled to a rigid housing of a host, wherein each retaining element has a sliding slot having first and second slide portions in communication with each other, wherein each sliding slot is angled relative to a second direction between the first and second slide portions; and
a locking element having two opposite pivot elements, each pivot element extending into one of the sliding slots such that the locking element is pivotable about the pivot element;
wherein upon positioning the locking element so that the pivot element is positioned in the first slide portions of the retaining elements, the locking element is pivotable from an open position to an intermediate position, and wherein upon sliding the locking element along the second direction to move the pivot element from the first slide portions to the second slide portions, the locking element is movable from the intermediate position to a lock position to lock an interface card that has been inserted in the first direction into a card slot of the host, wherein the card slot extends along the second direction.

10. The locking device of claim 9, further comprising:
an elastic element secured to the locking element, wherein upon disposing the locking element in the lock position, the elastic element is deformed to increase friction force between the pivot element and the second slide portions of the retaining elements.

11. The locking device of claim 10, wherein the elastic element is a spring piece or a spring.

12. The locking component of claim 9, wherein the first direction is substantially perpendicular to the second direction.

13. The locking component of claim 9, wherein the two opposite pivot elements are located near a distal end of the locking element, and wherein the distal end of the locking element is angled relative to the second direction toward the interface card.

14. The locking component of claim 9, wherein a distance between the sliding slots and the interface card prevents the locking element from pivoting about the pivot element when the locking element is in the lock position.

15. The locking component of claim 9, wherein the pivot element has a pivot axis that is perpendicular to the first direction and the second direction.

16. The locking component of claim 9, wherein the locking element is narrower than the interface card.

17. A host, comprising:
a rigid housing;
a circuit board securing within the rigid housing;
a card slot in the circuit board, extending along a second direction, the card slot being for inserting an interface card in a first direction which is substantially perpendicular to the second direction;
a locking device which comprises:
two opposite retaining elements coupled to the rigid housing;
a pivot element secured between the two opposite retaining elements; and
a locking element including two opposite sliding slots, each sliding slot having first and second slide portions in communication with each other, wherein each sliding slot is angled relative to a second direction between the first and second slide portions, wherein the pivot element extends through the sliding slots;
wherein upon disposing the pivot element in the first slide portions of the locking element, the locking element is pivotable about the pivot element from an open position to an intermediate position, and wherein upon sliding the locking element along the second direction to move the pivot element from the first slide portions to the second slide portions of the locking element, the locking element is movable from the intermediate position to a lock position to lock the interface card into the card slot.

18. The host of claim 17, further comprising:
an elastic element secured to the locking element, wherein upon positioning the locking element in the lock position, the elastic element is deformed against the pivot element such that the friction force between the pivot element and the second slide portions increases.

19. The host of claim 18, wherein the elastic element is a spring piece or a spring.

20. The host of claim 17, wherein the interface card has an end portion that is disposed along a supporting portion of the rigid housing when the interface card is inserted into the card slot, and wherein the locking element secures the end portion of the interface card against a supporting portion of the rigid housing when the locking element is in the lock position.

* * * * *